United States Patent
Ahn et al.

(10) Patent No.: US 9,024,857 B2
(45) Date of Patent: May 5, 2015

(54) GATE DRIVING APPARATUS AND DISPLAY DEVICE INCLUDING THE SAME

(75) Inventors: Si-Hyun Ahn, Cheonan-si (KR);
Byoung-Sun Na, Hwaseong-si (KR);
Kyong-Sik Choi, Cheonan-si (KR);
Hye-Rim Han, Seongnam-si (KR);
Seon-Kyoon Mok, Hwaseong-si (KR);
So-Young Kim, Jeju-si (KR); Woo-Jung Shin, Ansan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 761 days.

(21) Appl. No.: 13/074,378

(22) Filed: Mar. 29, 2011

(65) Prior Publication Data

US 2012/0056858 A1   Mar. 8, 2012

(30) Foreign Application Priority Data

Sep. 8, 2010   (KR) ........................ 10-2010-0088047

(51) Int. Cl.
| | |
|---|---|
| G09G 3/36 | (2006.01) |
| G02F 1/1343 | (2006.01) |
| G02F 1/1345 | (2006.01) |
| G06F 3/038 | (2013.01) |
| G11C 19/28 | (2006.01) |

(52) U.S. Cl.
CPC .............. *G09G 3/3677* (2013.01); *G11C 19/28* (2013.01); *G09G 2310/0286* (2013.01); *G09G 2300/0426* (2013.01)

(58) Field of Classification Search
CPC ... G09F 3/3677; G09G 3/3688; G02F 1/1339; G02F 1/13454
USPC ................. 345/55, 84, 87–93, 204–206, 100; 349/149–152, 148
See application file for complete search history.

(56) References Cited

U.S. PATENT DOCUMENTS

| | | | |
|---|---|---|---|
| 2006/0022201 A1* | 2/2006 | Kim et al. ........................ | 257/72 |
| 2008/0018572 A1* | 1/2008 | Shin et al. ........................ | 345/87 |
| 2009/0122213 A1* | 5/2009 | Ko et al. .......................... | 349/46 |

* cited by examiner

*Primary Examiner* — Lun-Yi Lao
*Assistant Examiner* — Jarurat Suteerawongsa
(74) *Attorney, Agent, or Firm* — F. Chau & Associates, LLC

(57) ABSTRACT

Provided are a gate driving apparatus and a display device including the same. The gate driving apparatus includes a plurality of stages arranged sequentially, each stage is adapted to output a gate signal and including first output lines and a second output line, wherein the first output lines are electrically connected to a gate line corresponding to each of the stages and are adapted to transmit the gate signal to a plurality of pixels coupled to the gate line, the second output line is adapted to transmit the gate signal to a preceding stage of each of the stages, and the first output lines and the second output line share one contact pad.

20 Claims, 8 Drawing Sheets

GATE DRIVING APPARATUS AND DISPLAY DEVICE INCLUDING THE SAME

This application claims priority from Korean Patent Application No. 10-2010-0088047 filed on Sep. 8, 2010, the disclosure of which is hereby incorporated by reference herein in its entirety.

BACKGROUND OF THE INVENTION

1. Technical Field

The present disclosure relates to a gate driving apparatus and a display device including the same, and more particularly, to a gate driving apparatus having reduced static electricity.

2. Description of the Related Art

Liquid crystal displays (LCDs) are a widely used type of flat panel displays. Generally, an LCD includes a pair of substrates having electrodes disposed thereon, and a liquid crystal layer interposed between the substrates. In an LCD, voltages may be applied to the electrodes to generate an electric field. Accordingly, an alignment of liquid crystal molecules in the liquid crystal layer may be controlled, and a polarization of incident light may thereby be controlled. As a result, a desired image may be displayed on the LCD.

In a conventional LCD, gate driving integrated circuits (ICs) are typically mounted using a tape carrier package (TCP) method or a chip on the glass (COG) method. However, other methods may be needed to improve the LCD, such as, for example, by lowering manufacturing costs and/or product size, and by simplifying or otherwise improving design of the LCD.

Accordingly, a gate driver, which generates a gate signal using an amorphous silicon thin-film transistor (TFT) directly mounted on a glass substrate, has been developed. However, substantial amounts of electric charges may accumulate in or near a source or drain line, a gate line, or a gate insulating film, for example, when a plurality of the amorphous silicon TFTs are disposed in such a gate driver. The electric charges that accumulate may in turn generate static electricity in a gate driving apparatus, and when a display device having the gate driving apparatus operates, performance of the display device may consequently be substantially degraded. Thus, there is substantial need to develop a gate driving apparatus having reduced static electricity.

SUMMARY OF THE INVENTION

Aspects of the present invention may provide a gate driving apparatus having reduced static electricity.

Aspects of the present invention may also provide a display device including the gate driving apparatus.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a gate driving apparatus including a plurality of stages arranged sequentially, each stage is adapted to output a gate signal and including first output lines and a second output line, wherein the first output lines are electrically connected to a gate line corresponding to each of the stages and are adapted to transmit the gate signal to a plurality of pixels coupled to the gate line, the second output line is adapted to transmit the gate signal to a preceding stage of each of the stages, and the first output lines and the second output line share one contact pad.

According to another aspect of the present invention, there is provided a gate driving apparatus including a plurality of stages arranged sequentially, each stage is adapted to output a gate signal and including a pull-up unit, first output lines, a second output line, a pull-down unit, and a storage voltage line, wherein the pull-up unit is adapted to generate the gate signal, the first output lines are electrically connected to a gate line corresponding to each of the stages and are adapted to transmit the gate signal to a plurality of pixels coupled to the gate line, the second output line is adapted to transmit the gate signal to a preceding stage of each of the stages, the pull-down unit is adapted to receive a gate signal of a subsequent stage and is adapted to discharge the gate signal of each of the stages to an off voltage, and the storage voltage line is disposed between the pull-up and pull-down units and the contact pad, wherein the first output lines are disposed between the pull-up unit and the storage voltage line but are not disposed between the pull-down unit and the storage voltage line.

According to another aspect of the present invention, there is provided a display device including: a substrate including a display region in which a plurality of pixels are arranged and a non-display region which is a region excluding the display region; and a gate driver including a gate driving apparatus which is formed in the non-display region, wherein the gate driver includes a plurality of stages arranged sequentially, each stage is adapted to output a gate signal and including first output lines and a second output line, wherein the first output lines are connected to a gate line corresponding to each of the stages and are adapted to transmit the gate signal to a plurality of pixels coupled to the gate line, the second output line is adapted to transmit the gate signal to a preceding stage of each of the stages, and the first output lines and the second output line share one contact pad.

In accordance with another aspect of the present invention, a display device is provided. The display device includes a liquid crystal panel comprising a first substrate including a display region on which a plurality of gate lines extending along a substantially row direction and substantially parallel to each other, a plurality of data lines extend along a substantially column direction and substantially parallel to each other, a plurality of pixel switching devices and a plurality of pixel electrodes are disposed and a non-display region which is a region excluding the display region and a second substrate on which a plurality of color filters and a common electrode are formed and a liquid crystal layer interposed between the first substrate and the second substrate. The display device further includes
a timing controller adapted to receive input control signals and to output a first control signal and a second control signal, a data driver adapted to receive an image signal and the first control signal from the timing controller and adapted to provide image data voltages, which correspond to the image signal to the plurality of data lines and wherein the first control signal received from the timing controller controls operation of the data driver and a clock generator adapted to receive the second control signal from the timing controller and adapted to output a clock signal and a clock bar signal using a gate-on voltage and a gate-off voltage in response to receiving the second control signal from the timing controller. The display device further includes a gate driver comprising a gate driving apparatus which is formed in the non-display region of the first substrate of the liquid crystal panel, the gate driver adapted to generate a plurality of gate signals using the clock signal and the clock bar signal received from the clock generator and is adapted to sequentially transmit the gate signals to the gate lines. The gate driver includes a plurality of stages arranged sequentially, each stage is adapted to output a gate signal and comprising first output lines and a second output line, wherein the first output lines are connected to a gate line corresponding to each of the stages and are adapted to transmit the gate signal to a plurality of pixels coupled to the gate line, the second output line is adapted to transmit the gate signal to a preceding stage of each of the stages, and the first output lines and the second output line share one contact pad.

BRIEF DESCRIPTION OF THE DRAWINGS

Exemplary embodiments of the present invention can be understood in more detail from the following detail description taken in conjunction with the attached drawings, in which.

DETAILED DESCRIPTION OF EXEMPLARY EMBODIMENTS OF THE INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. In the drawings, sizes and relative sizes of layers and elements may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. Like reference numerals refer to like elements throughout the specification. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Also, since a drain (or drain electrode) and a source (or source electrode) may be named differently according to the direction of current, an element called a drain or drain electrode hereinafter may operate as a source or source electrode, and an element called a source or source electrode may operate as a drain or drain electrode. Accordingly, an element called a drain or drain electrode is not limited to the drain or drain electrode. Also, the element called the source or source electrode is not limited to the source or source electrode.

Hereinafter, exemplary embodiments of a gate driving apparatus and a display device including the same will be described in detail with reference to the accompanying drawings.

Figure 1:
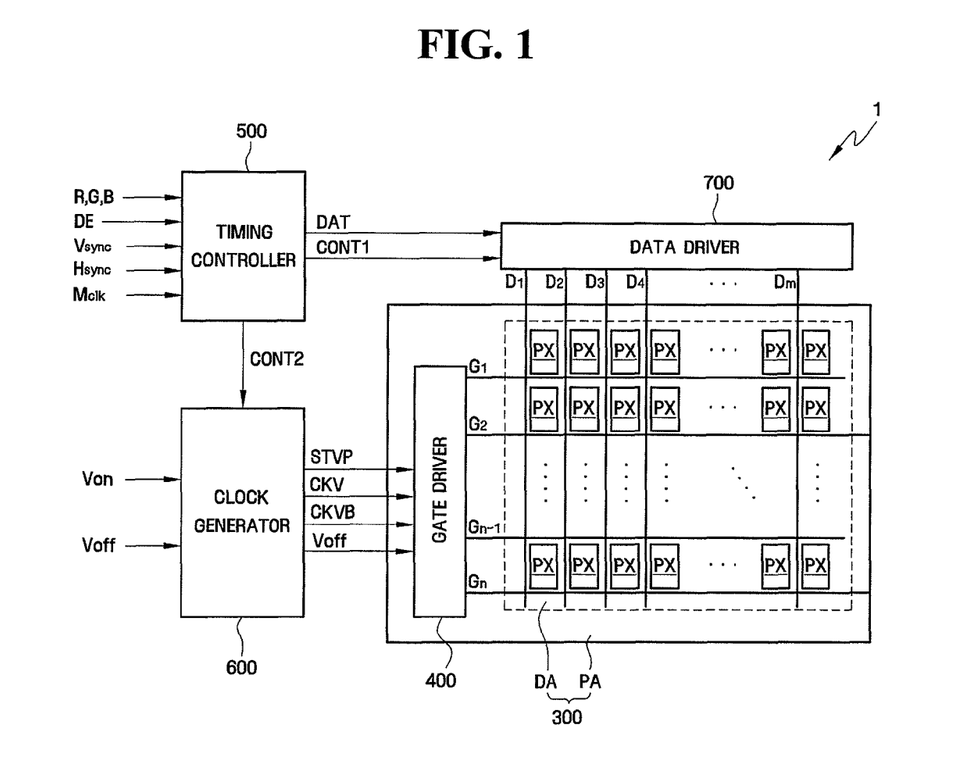
FIG. 1 is a block diagram of exemplary embodiments of a gate driving apparatus and a display device including the same.
Figure 2:
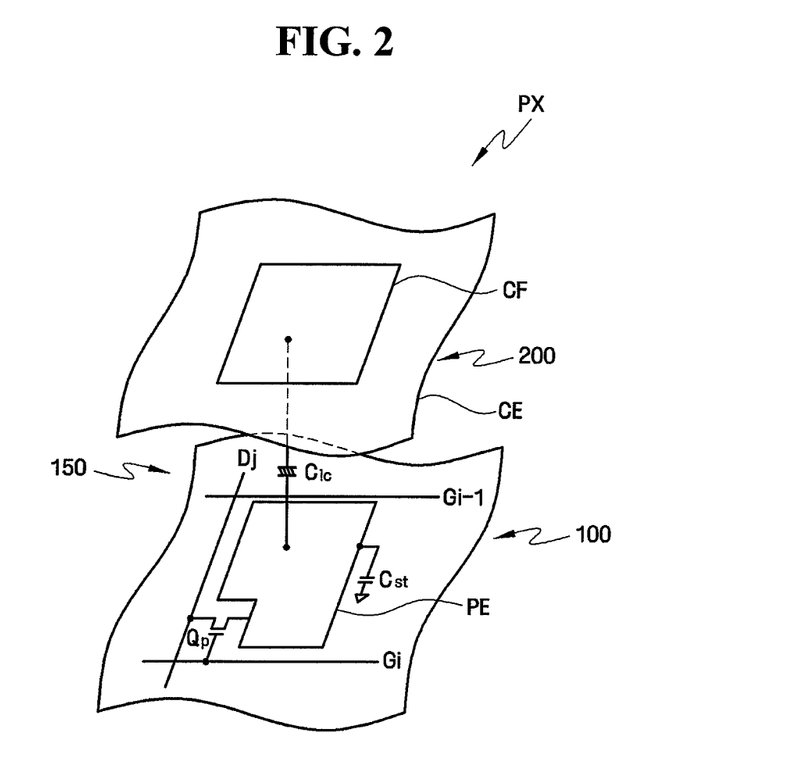
FIG. 2 is an equivalent circuit diagram of a pixel shown in FIG. 1.
Figure 3:
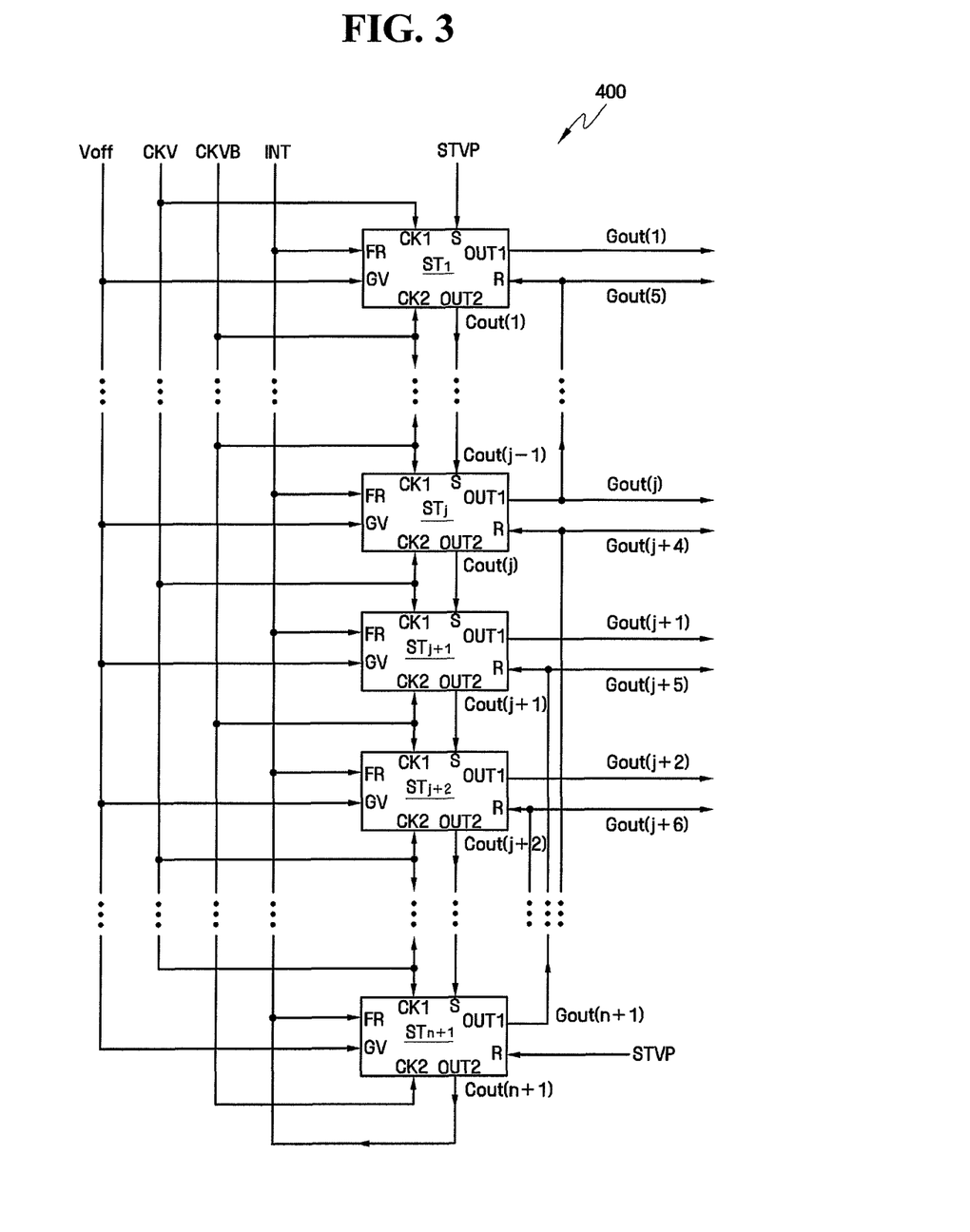
FIG. 3 is an exemplary block diagram of the gate driving apparatus included in a gate driver of FIG. 1.
Figure 4:
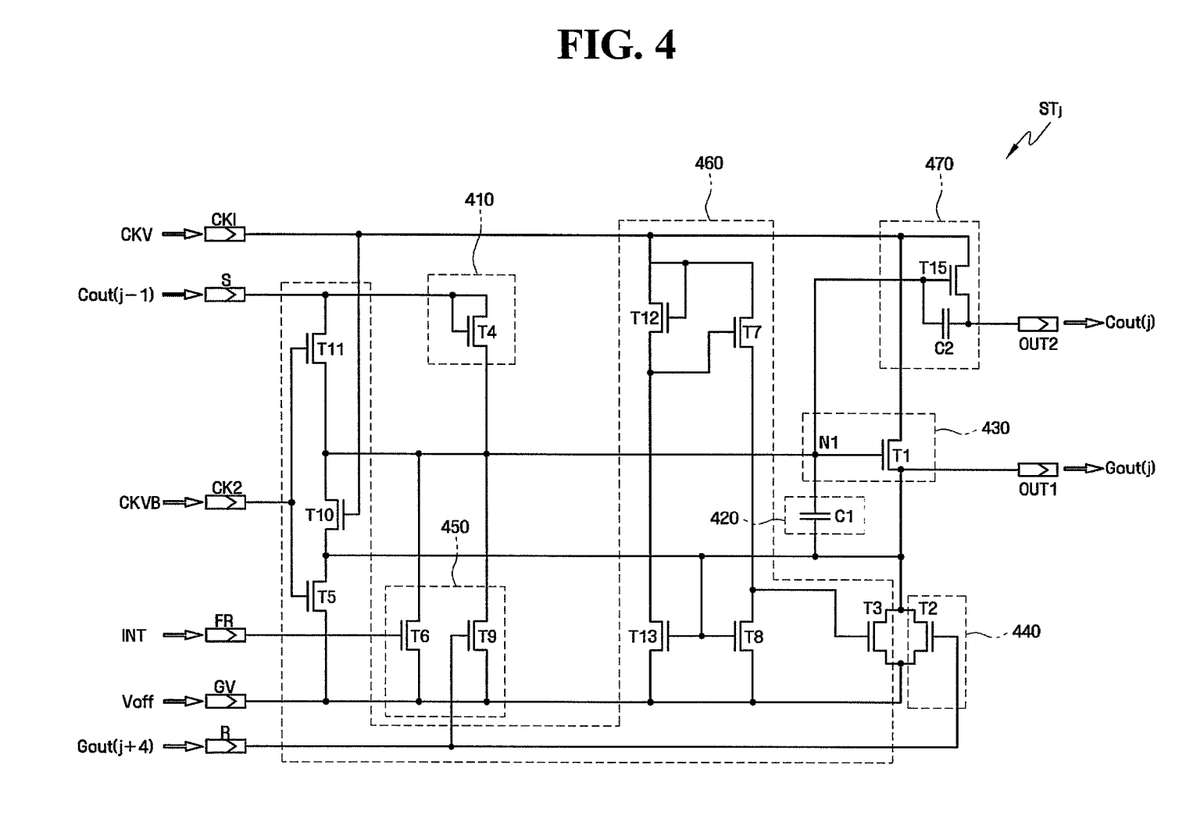
FIG. 4 is an exemplary circuit diagram of a $j^{th}$ stage shown in FIG. 3.

A gate driving apparatus and a display device including the same according to an exemplary embodiment of the present invention will now be described with reference to FIGS. 1 through 4. FIG. 1 is a block diagram of exemplary embodiments of a gate driving apparatus and a display device 1 including the same. FIG. 2 is an equivalent circuit diagram of a pixel PX shown in FIG. 1. FIG. 3 is an exemplary block diagram of the gate driving apparatus included in a gate driver 400 of FIG. 1. FIG. 4 is an exemplary circuit diagram of a $j^{th}$ stage STj shown in FIG. 3.

Referring to FIG. 1, the display device 1 according to an exemplary embodiment includes a liquid crystal panel 300, a timing controller 500, a clock generator 600, the gate driver 400, and a data driver 700.

The liquid crystal display 300 is divided into a display region DA in which an image is displayed and a non-display region PA in which the image is not displayed.

To display the image, the display region DA includes a first substrate 100 (see FIG. 2) on which a plurality of gate lines G1 through Gn, a plurality of data lines D1 through Dm, a plurality of pixel switching devices Qp (see FIG. 2) and a plurality of pixel electrodes PE (see FIG. 2) are disposed, a second substrate 200 (see FIG. 2) on which a plurality of color filters CF (see FIG. 2) and a common electrode CE (see FIG. 2) are disposed, and a liquid crystal layer 150 (see FIG. 2) which is interposed between the first and second substrates 100 and 200. However, the disposition of these elements is not limited to the above example. For example, in some other embodiments, the color filters CF may be disposed on the first substrate 100. The gate lines G1 through Gn extend along a substantially row direction and substantially parallel to each other, and the data lines D1 through Dm extend along a substantially column direction and substantially parallel to each other. However, the disposition of the gate lines G1 through Gn and the data lines D1 through Dm is not limited to the above example.

Referring to FIG. 2, each pixel PX of FIG. 1 includes a color filter CF formed on a region of the common electrode CE on the second substrate 200 to face a pixel electrode PE on the first substrate 100. Each pixel PX is connected to an $i^{th}$ (i=1 to n) gate line Gi and a $j^{th}$ (j=1 to m) data line Dj. In addition, each pixel PX includes one of the pixel switching devices Qp, which is connected to the $i^{th}$ gate line Gi and the $j^{th}$ data line Dj, and a liquid crystal capacitor Clc and a storage capacitor Cst connected to the pixel switching device Qp. A common voltage may be applied to a terminal of the storage capacitor Cst and the common electrode CE.

Referring back to FIG. 1, the non-display region PA is a region in which no image is displayed because the first substrate 100 (see FIG. 2) is wider than the second substrate 200 (see FIG. 2).

The timing controller 500 may receive input control signals, such as a horizontal synchronization signal Hsync, a main clock signal Mclk and a data enable signal DE, and outputs a first control signal CONT1. The first control signal CONT1 may control the operation of the data driver 700. Examples of the first control signal CONT1 may include but are not limited to a horizontal start signal for starting the data driver 700 and a load signal for instructing the output of data voltages.

The data driver 700 may receive an image signal DAT and the first control signal CONT1, and may provide image data voltages, which correspond to the image signal DAT, to the data lines D1 through Dm, respectively. The data driver 700 may be disposed as integrated circuits (ICs) connected to the liquid crystal panel 300 in the form of a tape carrier package (TCP). However, the present invention is not limited thereto. The data driver 700 may also be disposed in the non-display region PA of the first substrate 100.

The timing controller 500 may provide a second control signal CONT2 to the clock generator 600. The clock generator 600 may receive the second control signal CONT2 and outputs a clock signal CKV and a clock bar signal CKVB. That is, in response to the second control signal CONT2, the clock generator 600 may output the clock signal CKV and the clock bar signal CKVB using a gate-on voltage Von and a gate-off voltage Voff. Examples of the second control signal CONT2 may include but are not limited to an output enable signal OE (not shown) and a gate clock signal CPV (not shown). The clock signal CKV and the clock bar signal CKVB are pulse signals that swing between the gate-on voltage Von and the gate-off voltage Voff. The clock signal CKV may be a reverse phase signal of the clock bar signal CKVB.

The gate driver 400 includes the gate driving apparatus. When enabled by a scan start signal STVP, the gate driving apparatus may generate a plurality of gate signals using the clock signal CKV, the clock bar signal CKVB and the gate-off voltage Voff, and may sequentially transmit the gate signals to the gate lines G1 through Gn, respectively. The gate driving apparatus of the gate driver 400 may be disposed in the non-display region PA of the first substrate 100.

The gate driving apparatus of the gate driver 400 will now be described in further detail with reference to FIG. 3. Although now shown in the drawings, a plurality of the gate drivers 400 may be disposed on two sides of the non-display region PA of the first substrate 100. In this case, a gate driver 400 disposed on a first side of the non-display region PA of the first substrate 100 may drive, e.g., even gate lines of the gate lines G1 through Gn, while a different gate driver 400 disposed on an opposite second side of the non-display region PA may drive, e.g., odd gate lines of the gate lines G1 through Gn.

As shown in FIG. 3, the gate driving apparatus of the gate driver 400 includes first through $(n+1)^{th}$ stages $ST_1$ through $ST_{n+1}$, where n is a natural number. The first through $(n+1)^{th}$ stages $ST_1$ through $ST_{n+1}$ are connected to each other in a cascade manner. The first through $n^{th}$ stages $ST_1$ through $ST_n$, excluding the last stage $ST_{n+1}$, are connected to the gate lines G1 through Gn, respectively, and output gate signals $Gout_{(1)}$ through $Gout_{(n)}$ to the gate lines G1 through Gn, respectively. The gate-off voltage Voff, the clock signal CKV, the clock bar signal CKVB, and an initialization signal INT are input to each of the first through $(n+1)^{th}$ stages $ST_1$ through $ST_{n+1}$. Here, the initialization signal INT may be provided by the clock generator 600 or, alternatively, by the timing controller 500.

Each of the first through $(n+1)^{th}$ stages $ST_1$ through $ST_{n+1}$ includes a first clock terminal CK1, a second clock terminal CK2, a set terminal S, a reset terminal R, a voltage source terminal GV, a frame reset terminal FR, a gate output terminal OUT1 and a carry output terminal OUT2. Hereinafter, stages preceding a current stage, that is, the first through $(j-1)^{th}$ stages $ST_1$ through $ST_{j-1}$ preceding the $j^{th}$ stage $ST_j$ among the first through $(n+1)^{th}$ stages $ST_1$ through $ST_{n+1}$, will be referred to as "preceding stages," and stages subsequent to the current stage, that is, the $(j+1)^{th}$ through $(n+1)^{th}$ stages $ST_{j+1}$ through $ST_{n+1}$ subsequent to the $j^{th}$ stage $ST_j$, will be referred to as "subsequent stages." In addition, a stage immediately preceding the current stage, that is, the $(j-1)^{th}$ stage $ST_{j-1}$ immediately preceding the $j^{th}$ stage $ST_j$, will be referred to as a "previous stage," and a stage immediately subsequent to the current stage, that is, the $(j+1)^{th}$ stage $ST_{j+1}$ immediately subsequent to the $j^{th}$ stage $ST_j$, will be referred to as a "next stage."

For purposes of explanation, the $j^{th}$ stage $ST_j$, for example, connected to a $j^{th}$ gate line (where j≠1 and is a natural number ranging from 2 through n−1) will now be described in further detail with reference to FIG. 3. A carry signal $Cout_{(j-1)}$ of a previous stage, e.g., the $(j-1)^{th}$ stage $ST_{j-1}$, is input to the set terminal S of the $j^{th}$ stage $ST_j$, the gate signal $Gout_{(j+4)}$ of a subsequent stage, e.g., the $(j+1)^{th}$ stage $ST_{j+4}$, is input to the reset terminal R of the $j^{th}$ stage $ST_j$, and the clock signal CKV and the clock bar signal CKVB are input to the first clock terminal CK1 and the second clock terminal CK2, respectively, of the $j^{th}$ stage $ST_j$.

In addition, the gate-off voltage Voff is input to the voltage source terminal GV of the $j^{th}$ stage $ST_j$, and the initialization signal INT or, alternatively, a carry signal $Cout_{(n+1)}$ of a last stage, e.g., the $(n+1)^{th}$ stage $ST_{n+1}$, is input to the frame reset terminal FR of the $j^{th}$ stage $ST_j$. The gate output terminal OUT1 outputs the gate signal $Gout_{(j)}$ to a main gate line, and the carry output terminal OUT2 outputs a carry signal $Cout_{(j)}$.

While a case where the gate signal $Gout_{(j+4)}$ output from the subsequent stage $ST_{j+4}$ is input to the reset terminal R of the $j^{th}$ stage $ST_j$ has been described above as an example, the present invention is not limited to this case. For example, a gate signal output from a stage one or more stages subsequent to the $j^{th}$ stage $ST_j$ may be input to the reset terminal R of the $j^{th}$ stage $ST_j$.

The scan start signal STVP, instead of a carry signal of a previous stage of the first stage $ST_1$, is input to the first stage $ST_1$. In addition, the scan start signal STVP, instead of a gate signal of a next stage of the last stage $ST_{n+1}$, is input to the last stage $ST_{n+1}$. The scan start signal STVP input to the first stage $ST_1$ is substantially the same as the scan start signal STVP input to the last stage $ST_{n+1}$.

The $j^{th}$ stage $ST_j$ shown in FIG. 3 will now be described in further detail with reference to FIG. 4. Referring to FIG. 4, the $j^{th}$ stage $ST_j$ includes a buffer unit 410, a charging unit 420, a pull-up unit 430, a carry signal generation unit 470, a pull-down unit 440, a discharging unit 450, and a holding unit 460.

The carry signal Cout$_{(j-1)}$ of the previous stage ST$_{j-1}$, the clock signal CKV, and the clock bar signal CKVB are provided to the j$^{th}$ stage ST$_j$.

The buffer unit 410 includes a diode-connected transistor T4. The buffer unit 410 provides the carry signal Cout$_{(j-1)}$ of the previous stage ST$_{j-1}$, which is received through the set terminal S, to the charging unit 420 connected to a source of the transistor T4, the carry signal generation unit 470, the discharging unit 450, and the holding unit 460.

The charging unit 420 includes a capacitor C1 including a first terminal, which is connected to the source of the transistor T4 and the discharging unit 450, and a second terminal which is connected to the gate output terminal OUT1 of the j$^{th}$ stage ST$_j$. The charging unit 420 is charged by the carry signal Cout$_{(j-1)}$ of the previous stage ST$_{j-1}$.

The pull-up unit 430 includes a transistor T1 including a drain connected to the first clock terminal CK1, a gate connected to the first terminal of the capacitor C1, and a source connected to the second terminal of the capacitor C1 and the gate output terminal OUT1. When the capacitor C1 of the charging unit 420 is charged, the transistor T1 is turned on. When turned on, the transistor T1 may receive the clock signal CKV through the first clock terminal CK1 and provides the clock signal CKV as the gate signal Gout$_{(j)}$ through the gate output terminal OUT1. That is, when the clock signal CKV is at a high level, the gate-on voltage Von may be output.

The carry signal generation unit 470 includes a transistor T15 and a capacitor C2. The transistor T15 includes a drain connected to the first clock terminal CK1, a source connected to the carry output terminal OUT2, and a gate connected to the buffer unit 410. In addition, the capacitor C2 is connected to the gate and source of the transistor T15. The capacitor C2 is charged the same as the charging unit 420. When the capacitor C2 is charged, the transistor T15 may output the first clock signal CKV as the carry signal Cout$_{(j)}$ through the carry output terminal OUT2.

The pull-down unit 440 includes a transistor T2 including a drain connected to the source of the transistor T1 and the second terminal of the capacitor C1, a source connected to the voltage source terminal GV, and a gate connected to the reset terminal R. The pull-down unit 440 may be turned on by the gate signal Gout$_{(j+4)}$ of the subsequent stage ST$_{j+4}$ which is input through the reset terminal R. When turned on, the pull-down unit 440 may pull down the gate signal Gout$_{(j)}$ to the gate-off voltage Voff.

The discharging unit 450 includes transistors T6 and T9. The transistor T9 includes a gate connected to the reset terminal R, a drain connected to the first terminal of the capacitor C1, and a source connected to the voltage source terminal GV. The transistor T9 may discharge the charging unit 420 in response to the gate signal Gout$_{(j+4)}$ of the subsequent stage ST$_{(j+4)}$. The transistor T6 includes a gate connected to the frame reset terminal FR, a drain connected to the first terminal of the capacitor C1, and a source connected to the voltage source terminal GV. The transistor T6 may discharge the charging unit 420 in response to the initialization signal INT. That is, the discharging unit 450 may discharge electric charges charged in the capacitor C1 to the gate-off voltage Voff through the source, in response to the gate signal Gout$_{(j+4)}$ of the stage ST$_{j+4}$ or the initialization signal INT. Here, the initialization signal INT may be a carry signal Cout$_{(j+1)}$ of a dummy stage, e.g., the (n+1)$^{th}$ stage ST$_{n+1}$.

The holding unit 460 includes a plurality of transistors T3, T5, T7, T8, T10, T11, T12 and T13. When the gate signal Gout$_{(j)}$ shifts from a low level to a high level, the holding unit 460 may hold the gate signal Gout$_{(j)}$ at the high level. Likewise, when the gate signal Gout$_{(j)}$ shifts from a high level to a low level, the holding unit 460 may hold the gate signal Gout$_{(j)}$ at the low level during a frame, without regard to voltage levels of the clock signal CKV and the clock bar signal CKVB.

For example, the transistor T3 includes a drain connected to the gate output terminal OUT1 and a source connected to the gate-off voltage Voff. The transistors T7 and T8 may be turned on when the gate signal Gout$_{(j)}$ output through the gate output terminal OUT1 is at a high level. When turned on, the transistors T7 and T8 may pull down a gate of the transistor T3 to the gate-off voltage Voff, thereby turning off the transistor T3. Accordingly, the gate signal Gout$_{(j)}$ may be held at the high level.

The transistor T11 includes a drain connected to the set terminal S, a gate connected to a second clock terminal CK2, and a source connected to the first terminal of the capacitor C1. The transistor T10 includes a drain connected to the source of the transistor T11 and the first terminal of the capacitor C1, a gate connected to the first clock terminal CK1, and a source connected to the gate output terminal OUT1. The transistor T5 includes a drain connected to the gate output terminal OUT1, the gate common to the transistors T5 and T11 and connected to the second clock terminal CK2, and a source connected to the voltage source terminal GV.

When the clock bar signal CKVB is at a high level, the gate signal Gout$_{(j)}$ may be at a low level. Accordingly, the transistor T5 may be turned on and may hold the gate output terminal OUT1 at the gate-off voltage Voff.

Figure 5:
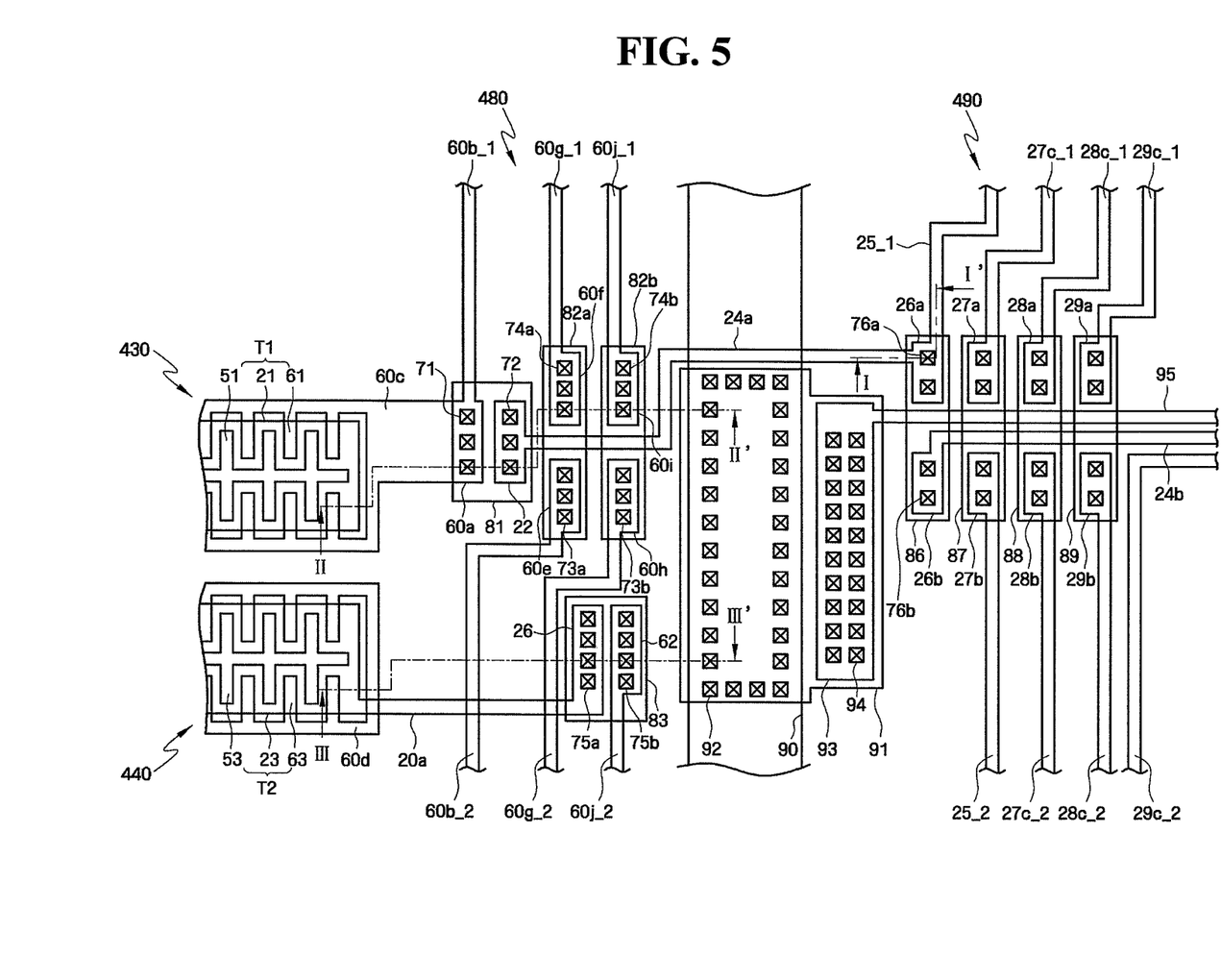
FIG. 5 is a layout diagram of a portion of a $j^{th}$ stage of a gate driving apparatus according an exemplary embodiment of the present invention.
Figure 6:
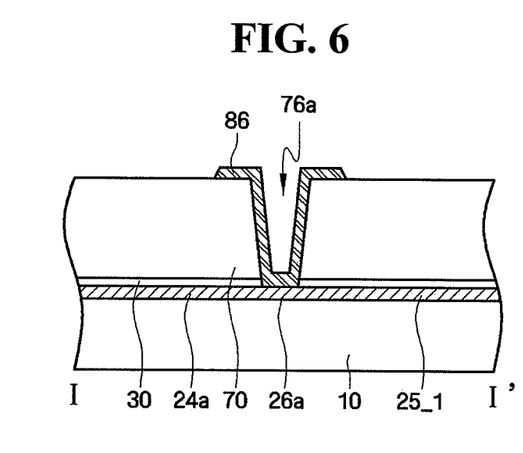
FIG. 6 is a cross-sectional view taken along the line I-I' of FIG. 5.
Figure 7:
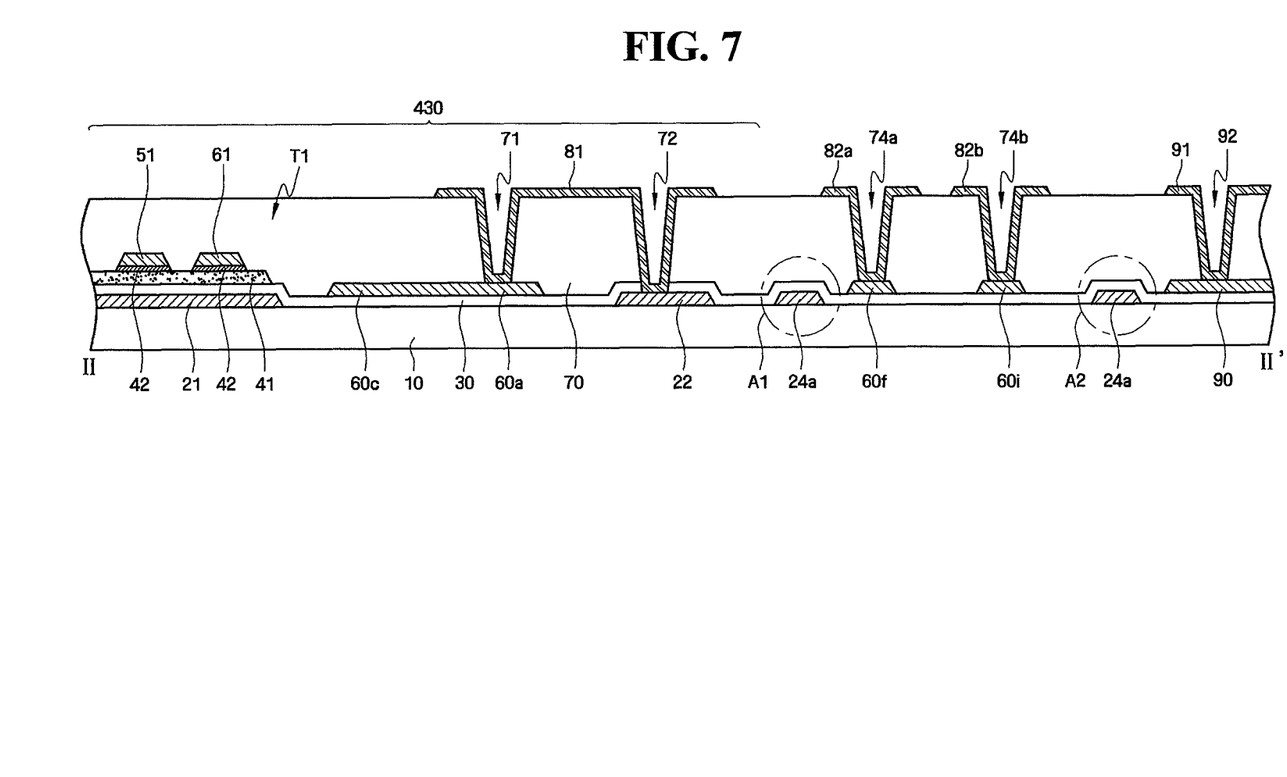
FIG. 7 is a cross-sectional view taken along the line II-II' of FIG. 5.
Figure 8:
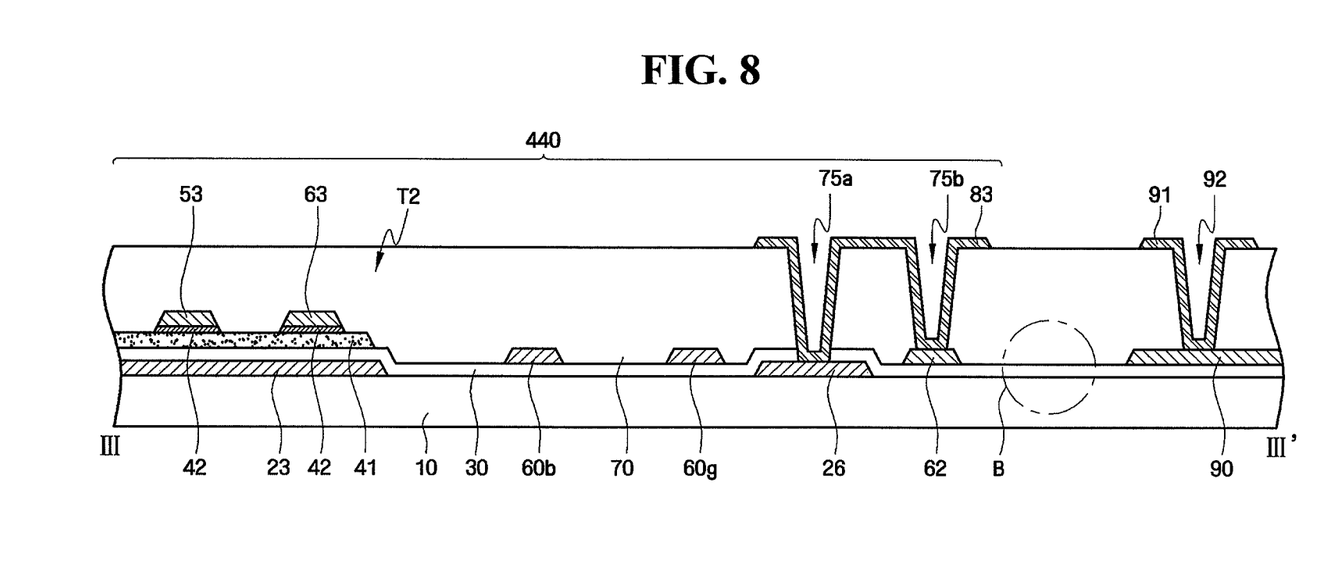
FIG. 8 is a cross-sectional view taken along the line III-III' of FIG. 5.

Hereinafter, a gate driving apparatus according to an exemplary embodiment will be described in greater detail with reference to FIGS. 5 through 8. FIG. 5 is a layout diagram of a portion of a j$^{th}$ stage of a gate driving apparatus according an exemplary embodiment of the present invention. FIG. 6 is a cross-sectional view taken along the line I-I' of FIG. 5. FIG. 7 is a cross-sectional view taken along the line II-II' of FIG. 5. FIG. 8 is a cross-sectional view taken along the line of FIG. 5.

In FIGS. 5 through 8, one of the first through n$^{th}$ stages ST$_1$ through ST$_n$ shown in FIG. 3 will be described as an example. Hereinafter, the transistor T1 of the pull-up unit 430 will be referred to as a "first transistor" T1, and the transistor T2 of the pull-down unit 440 will be referred to as a "second transistor" T2.

Referring to FIGS. 5 through 8, the gate driving apparatus according to an exemplary embodiment includes a plurality of stages which are arranged sequentially and output gate signals, respectively. Each of the stages includes first output lines (24a and 24b) and a second output line 25_1. The first output lines (24a and 24b) are electrically connected to a gate line, which corresponds to each stage, and transmit a gate signal to the gate line to which a plurality of pixels are coupled. The second output line 25_1 extends to a preceding stage of each stage and transmits a gate signal to the preceding stage.

Each stage includes the pull-up unit 430 which generates a gate signal. The first transistor T1 of the pull-up unit 430 includes a first gate electrode 21, a first drain electrode 51, and a first source electrode 61.

The first gate electrode 21 may be rectangular. However, the shape of the first gate electrode 21 is not limited to the rectangular shape, and the first gate electrode 21 can have various shapes.

The first drain electrode 51 may be shaped substantially like, for example, a fishbone antenna and may overlap the first gate electrode 21. A second source or drain line 60c surrounds the first drain electrode 51, and the first source electrode 61 branches off from the second source or drain line 60c to face the first drain electrode 51. The first source electrode 61 may overlap the first gate electrode 21. Portions of the first drain electrode 51 and the first source electrode 61 may be, for example, substantially cross finger-shaped.

The first source electrode 61 may provide a gate signal. A first source electrode contact unit 60a is connected to the first source electrode 61 by the second source or drain line 60c and may deliver a gate signal to a gate line contact unit 22. Since the gate line contact unit 22 and the first output lines (24a and 24b) are electrically connected to each other, the gate signal may be transmitted to a gate line (e.g., a main gate line), to which a plurality of pixels PX (see FIG. 1) of a display region DA (see FIG. 1) are coupled, through the first gate lines (24a and 24b).

In addition, a gate signal of a current stage is delivered to a previous stage through the first source electrode contact unit 60a and a first source or drain line 60b_1 connected to the first source electrode contact unit 60a, as will be described in further detail below. The first source electrode contact unit 60a and the gate line contact unit 22 are connected to each other by a bridge structure including, e.g., first contact holes 71, second contact holes 72, and a first bridge line 81.

Each stage includes the pull-down unit 440 which receives a gate signal of a subsequent stage and discharges a gate signal of the corresponding stage to an off voltage. The second transistor T2 of the pull-down unit 440 includes a second gate electrode 23, a second drain electrode 53, and a second source electrode 63.

The second gate electrode 23 is connected to a second pad 26 by a gate connection line 20a, and the second pad 26 is electrically connected to a first pad 62 by a fourth bridge line 83. The first pad 62 may receive a gate signal from a source or drain line 60j_2 of a subsequent stage and may transmit the received gate signal to the second transistor T2 of the pull-up unit 430 of the current stage through seventh contact holes 75a, eighth contact holes 75b, and the fourth bridge line 83. Therefore, the second gate electrode 23 can receive the gate signal of the subsequent stage. This will be described in further detail below.

Although not shown in the drawings, the second drain electrode 53 may be connected to the first source electrode 61 of the first transistor T1 by the second source or drain line 60c. The second transistor T2 has substantially the same structure as the first transistor T1, except that the second source electrode 63 branches off from a third source or drain line 60d, and thus any repetitive detailed description thereof will be omitted.

Each stage includes a first bridge region 480 which transmits a gate signal output from the pull-up unit 430 of a subsequent stage to the pull-down unit 440 of a preceding stage. The first bridge region 480 includes first source or drain lines 60b_1 and 60b_2, fourth source or drain lines 60g_1 and 60g_2, fifth source or drain lines 60j_1 and 60j_2, third through sixth contact holes 73a, 74a, 73b and 74b, and second and third bridge lines 82a and 82b.

The first source or drain line 60b1 is connected to the first source electrode contact unit 60a and extends to the previous stage. Therefore, the first source or drain line 60b_2 of a next stage extends to a second source electrode contact unit 60e of the current stage. The second source electrode contact unit 60e having the third contact holes 73a is electrically connected to a third source electrode contact unit 60f having the fourth contact holes 74a by the second bridge line 82a. The fourth source or drain line 60g_1 is connected to the third source electrode contact unit 60f and extends to a preceding stage, for example, the previous stage.

Likewise, the fourth source or drain line 60g_2 of the next stage extends to a fourth source electrode contact unit 60h having the fifth contact holes 73b. The fourth source electrode contact unit 60h is electrically connected to a fifth source electrode contact unit 60i having the sixth contact holes 74b by the third bridge line 82b. The fifth source or drain line 60j_1 is connected to the fifth source electrode contact unit 60i and extends to the previous stage.

As shown in the drawings, the fifth source or drain line 60j_2 of the next stage is electrically connected to the pull-up unit 430, for example, the first pad 62 of the pull-up unit 430 of the current stage.

Therefore, the second gate electrode 23 of the second transistor T2 can receive a gate signal of a subsequent stage through the first, fourth, and fifth source or drain lines 60b_1 and 60b_2, 60g_1 and 60g_2, and 60j_1 and 60j_2 of the first bridge region 480, which are electrically and successively connected to each other.

In the drawings, the current stage receives a gate signal from a stage three stages subsequent to the current stage. For example, when the current stage is the $j^{th}$ stage, it receives a gate signal from a $(j+3)^{th}$ stage. However, the present invention is not limited thereto. The second gate electrode 23 of the second transistor T2 may receive a gate signal from the next stage of the $j^{th}$ stage or from a stage two or more stages subsequent to the $j^{th}$ stage.

As shown in the drawings, the first output lines (24a and 24b) pass between the second and fourth source electrode contact units 60e and 60h which are separated from each other and between the third and fifth source electrode contact units 60f and 60i which are separated from each other. For example, the first output lines (24a and 24b) include a first gate signal transmission line 24a and a second gate signal transmission line 24b. The first gate signal transmission line 24a of the first output lines (24a and 24b) passes between the second and fourth source electrode contact units 60e and 60h and between the third and fifth source electrode contact units 60f and 60i.

The first gate signal transmission line 24a may transmit a gate signal generated by the pull-up unit 430 to a first contact pad 26a. In addition, the second gate signal transmission line 24b is connected to a second contact pad 26b, which is electrically connected to the first contact pad 26a by a bridge structure, and may transmit a gate signal to a gate line (e.g., the main gate line) corresponding to each stage. In other words, the first gate signal transmission line 24a extends from the gate line contact unit 22 to the first contact pad 26a, and the second gate signal transmission line 24b extends from the second contact pad 26b to a gate line (not shown) in a pixel region.

A storage voltage line 90 is formed adjacent to the pull-up unit 430 and the pull-down unit 440. For example, the storage voltage line 90 may be disposed between the pull-up and pull-down units 430 and 440 and the second bridge region 490. The second bridge region 490 includes a plurality of output lines which may transmit a gate signal to a preceding stage through at least one bridge line 86, 87, 88, or 89 including a pair of contact pads 26a/26b, 27a/27b, 28a/28b, or 29a/29b, as will be described later. Therefore, the storage voltage line 90 is disposed between the pull-up and pull-down units 430 and 440 and the contact pads 26a and 26b. In some embodiments, the first bridge region 480 may be interposed between the pull-up unit 430 and the storage voltage line 90, as shown in the drawings.

A storage contact unit 93 is disposed adjacent to the storage voltage line 90. The storage contact unit 93 is electrically connected to the storage voltage line 90 by a fifth bridge line 91. For example, the storage contact unit 93 may receive a storage voltage Vcst, which is applied to the storage voltage line 90, through first storage contact holes 92, second storage contact holes 94, and the fifth bridge line 91. In some other embodiments, the storage voltage Vcst may have a voltage level similar to that of a common voltage Vcom.

A storage line 95 extends from the storage contact unit 93 and overlaps a portion of a pixel electrode (not shown) formed in the pixel region (see the display region DA of FIG. 1). The overlapping of the storage line 95 and a portion of the pixel electrode results in the formation of the storage capacitor Cst of FIG. 2.

The second bridge region 490 is disposed adjacent to the storage voltage line 90. The second bridge region 490 is a region in which a plurality of output lines transmitting a gate signal to a preceding stage through at least one bridge line 86, 87, 88, or 89 are arranged.

As shown in the drawings, the first contact pad 26a and the second contact pad 26b are electrically connected by a bridge structure. For example, the first contact pad 26a and the second contact pad 26b are electrically connected by the sixth bridge line 86 disposed on and overlapping the first and second contact pads 26a and 26b, first gate contact holes 76a disposed on the first contact pad 26a, and second gate contact holes 76b disposed on the second contact pad 26b.

The first contact pad 26a extends from the first gate signal transmission line 24a, and the second output line 25_1 extends from the first contact pad 26a to a preceding stage.

Accordingly, the second output line 25_1 transmits a gate signal generated by the pull-up unit 430 of the current stage to the preceding stage. The first output lines (24a and 24b) and the second output line 25_1 share one contact pad, for example, the first contact pad 26a. For example, the first gate signal transmission line 24a of the first output lines (24a and 24b) and the second output line 25_1 may share one first contact pad 26a. Alternatively, the first gate signal transmission line 24a and the second output line 25_1 may be connected by the first contact pad 26a.

Referring to FIGS. 5 and 6, the first output lines (24a and 24b), for example, the first gate signal transmission line 24 of the first output lines (24a and 24b) and the second output line 25_1 share one first contact pad 26a.

As shown in FIG. 6, the first gate signal transmission line 24a, the first contact pad 26a, and the second output line 25_1 are formed on a substrate 10 and are connected to each other. In other words, the second output line 25_1 branches off from the first gate signal transmission line 24a.

The substrate 10 may be made of a heat-resisting and light-transmitting material such as, for example, transparent glass or plastic. However, the material that forms the substrate 10 is not limited to the above examples, and the substrate 10 may be made of various materials.

A gate insulating film 30 is formed on the first gate signal transmission line 24a, the first contact pad 26a, and the second output line 25_1. The gate insulating film 30 may be made of, but is not limited to, silicon nitride (SiNx).

A passivation film 70 is formed on the gate insulating film 30. The passivation film 70 includes the first gate contact holes 76a which expose portions of the first contact pad 26a. The passivation film 70 may be formed of, but is not limited to, an inorganic material such as silicon nitride or silicon oxide, an organic material having photosensitivity and beneficial planarization characteristics, or a low-k insulating material formed by plasma enhanced chemical vapor deposition (PECVD). The sixth bridge line 86 is formed on the passivation film 70 and electrically connects the first contact pad 26a and the second contact pad 26b through the first gate contact holes 76a.

Referring back to FIG. 5, a second output line 25_2 of the next stage extends to the third contact pad 27b of the current stage. The third contact pad 27b having third gate contact holes is electrically connected to the fourth contact pad 27a having fourth gate contact holes by the seventh bridge line 87. In addition, a third output line 27c_1 is connected to the fourth contact pad 27a and extends to a preceding stage, for example, the previous stage.

Likewise, a third output line 27c_2 of a subsequent stage, e.g., the next stage, is connected to the fifth contact pad 28b of the current stage. The fifth contact pad 28b having fifth gate contact holes is electrically connected to the sixth contact pad 28a having sixth gate contact holes by the eighth bridge line 88. In addition, a fourth output line 28c_1 is connected to the sixth contact pad 28a and extends to the previous stage.

A bridge structure including the ninth bridge line 89, seventh gate contact holes, the seventh contact pad 29b, eighth gate contact holes, and the eighth contact pad 29a is substantially similar to a bridge structure including the eighth bridge line 88, and thus a detailed description thereof is omitted for simplicity. Further, a fifth output line 29c_1 extending from the eighth contact pad 29a of the next stage is connected to a down gate line (not shown) in the pixel region and may transmit a gate signal of a subsequent stage to the down gate line.

Each stage includes the second contact pad 26b, which is electrically connected to the first contact pad 26b by a bridge structure, and one or more contact pad pairs 27a/27b, 28a/28b, and 29a/29b, wherein the contact pads 27a/27b, 28a/28b, or 29a/29b in each pair are electrically connected to each other by a bridge structure including the bridge line 87, 88 or 89. The contact pad pairs 27a/27b, 28a/28b, and 29a/29b may transmit a gate signal of a subsequent stage to a preceding stage.

In other words, each stage may transmit a gate signal output from the pull-up unit 430 of the current stage to the first contact pad 26a through the first gate signal transmission line 24a of the first output lines (24a and 24b) and may transmit a gate signal of the current stage to the main gate line through the second gate signal transmission line 24b connected to the second contact pad 26b which is electrically connected to the first contact pad 26a by a bridge structure.

The second output line 25_1 is connected to the first contact pad 26a and may transmit a gate signal of the current stage to a preceding stage and may transmit the gate signal of the current stage to the fifth output line 29c_1 of a fourth preceding stage from the current stage through a plurality of bridge structures including the seventh through ninth bridge lines 87, 88 and 89. In the drawing, four bridge structures, for example, are arranged in the second bridge region 490. However, the number of bridge structures is not limited to four and may be greater or less than four.

As shown in FIG. 5, the storage line 95 extending from the storage contact unit 93 passes through the sixth through ninth bridge lines 86 through 89. For example, the storage line 95 passes between the first, fourth, sixth, and eighth contact pads 26a, 27a, 28a and 29a and the second, third, fifth and seventh contact pads 26b, 27b, 28b and 29b which are separated from the first, fourth, sixth and eighth contact pads 26a, 27a, 28a, and 29a.

Referring to FIGS. 5, 7, and 8, the first output lines (24a and 24b) are disposed between the pull-up unit 430 and the storage voltage line 90 but not between the pull-down unit 440 and the storage voltage line 90.

As shown in FIGS. 5 and 7, the first transistor T1, the first source electrode contact unit 60a, the gate line contact unit 22, the first output lines (24a and 24b), the storage voltage line 90, and the fifth bridge line 91 are formed on the substrate 10. For simplicity, a detailed description of the above elements is omitted.

Gate patterns (21, 22, and 24a) are formed on the substrate 10. The gate patterns (21, 22 and 24a) include the first gate electrode 21, the gate line contact unit 22, and the first gate signal transmission line 24a.

The gate insulating film 30 is formed on the gate patterns (21, 22, and 24a), and a semiconductor layer 41 overlapping the first gate electrode 21 is formed on the gate insulating film 30. In addition, an ohmic contact layer 42 is formed on the semiconductor layer 41, and the first drain electrode 51 and the first source electrode 61 are formed on the ohmic contact layer 42. The first drain electrode 51 overlaps the first gate electrode 21.

The first source electrode contact unit 60a is connected to the second source or drain line 60c which extends from the first source electrode 61. The first source electrode contact unit 60a is coupled to the gate line contact unit 22 by the first bridge line 81 and transmits a gate signal to the first output lines (24a and 24b). The third source electrode contact unit 60f and the fifth source electrode contact unit 60i are also formed on the gate insulating film 30.

The storage voltage line 90 is formed on the gate insulating film 30. The storage voltage line 90 extends vertically as shown in FIG. 5, and may receive the storage voltage Vcst from an external source, and applies the received storage voltage Vcst to the storage line 95 through the fifth bridge line 91.

Hereinafter, the first source electrode 51, the second source or drain line 60c, and the first, third, and fifth source electrode contact units 60a, 60f and 60i may be referred to as source patterns, and the first drain electrode 61 may be referred to as a drain pattern.

The passivation film 70 is formed on the source patterns, the drain pattern, and the storage voltage line 90. The passivation film 70 includes the first contact holes 71 which expose portions of the first source electrode contact unit 60a, the second contact holes 72 which expose portions of the gate line contact unit 22, the fourth contact holes 74a which expose portions of the third source electrode contact unit 60f, and the sixth contact holes 74b which expose portions of the fifth source electrode contact unit 60i. The other source electrode contact units and contact holes not shown in FIG. 7 may have substantially similar structures to those of the above source electrode contact units and contact holes.

The first bridge line 81 is formed on the passivation film 70 and electrically connects the first source electrode contact unit 60a and the gate line contact unit 22 through the first and second contact holes 71 and 72. The second bridge line 82a is formed on the passivation film 70 and electrically connects the third source electrode contact unit 60f and the second source electrode contact unit 60e through the fourth contact holes 74a. Also, the third bridge line 82b is formed on the passivation film 70 and electrically connects the fifth source electrode contact unit 60i and the fourth source electrode contact unit 60h through the sixth contact holes 74b.

As shown in FIG. 7, the first transistor T1, the second source or drain line 60c, the first source electrode contact unit 60a, the gate line contact unit 22, the first and second contact holes 71 and 72, and the first bridge line 81 are included in the pull-up unit 430. Further, as shown in FIGS. 5 through 7, the first output lines (24a and 24b) pass between the pull-up unit 430 and the storage voltage line 90. As indicated by reference characters A1 and A2 in FIG. 7, the first output lines (24a and 24b), for example, the first gate signal transmission line 24a, may pass between the pull-up unit 430 and the storage voltage line 90.

As shown in FIGS. 5 through 8, the second transistor T2, the first source or drain line 60b_1, the fourth source or drain line 60g_1, the second pad 26, the first pad 62, the storage voltage line 90, the fourth bridge line 83, and the fifth bridge line 91 are formed on the substrate 10. For simplicity, a detailed description of the above elements is omitted.

Gate patterns (23 and 26) are formed on the substrate 10. The gate patterns (23 and 26) include the second gate electrode 23 and the second pad 26. The gate insulating film 30 is formed on the gate patterns (23 and 26), and the semiconductor layer 41 and the ohmic contact layer 42 which overlap the second gate electrode 23 are formed on the gate insulating film 30. The second drain electrode 53 and the second source electrode 63 are formed on the ohmic contact layer 42. The second drain electrode 53 overlaps the second gate electrode 23.

The first source or drain line 60b_1, the fourth source or drain line 60g_1, and the first pad 62 may hereinafter be referred to as source patterns, and the source patterns are formed on the gate insulating film 30.

The passivation film 70 is formed on the second transistor T2, the source patterns (60b_1, 60g_1 and 62), and the storage voltage line 90. The passivation film 70 includes the seventh contact holes 75a which expose portions of the first pad 62, the eighth contact holes 75b which expose portions of the second pad 26, and the first storage contact holes 92 which expose portions of the storage line 95. The other contact holes not shown in FIG. 8 may have a substantially similar structure to that of the contact holes described above.

The fourth bridge line 83 is formed on the passivation film 70 and electrically connects the second pad 26 and the first pad 62 through the seventh and eighth contact holes 75a and 75b. In addition, the fifth bridge line 91 is formed on the passivation film 70 and electrically connects the storage voltage line 90 and the storage contact unit 93 through the first storage contact holes 92.

As shown in FIG. 8, the second transistor T2, the second pad 26, the first pad 62, the seventh and eighth contact holes 75a and 75b, and the fourth bridge line 83 are included in the pull-down unit 440. Further, as shown in FIGS. 5 and 8, the first output lines (24a and 24b) are not disposed between the pull-down unit 440 and the storage voltage line 90. That is, as indicated by reference character B in FIG. 8, the first output lines (24a and 24b) do not pass between the pull-down unit 440 and the storage voltage line 90.

When the first output lines (24a and 24b) are disposed between the pull-down unit 440 and the storage voltage line 90 and when a distance between the first pad 62, which is located on a side of the pull-down unit 440, and the first output lines (24a and 24b) is smaller than an appropriate distance, static electricity may be generated between the first output lines (24a and 24b) and the first pad 62. The static electricity may flow into a stage through adjacent wirings and burn a transistor within the stage, thereby causing the transistor to malfunction. Consequently, the performance of the stage may be degraded.

To prevent this difficulty, the first output lines (24a and 24b) and the second output line 25_1 are made to share one contact pad 26a. Alternatively, the first output lines (24a and 24b) are placed between the pull-up unit 430 and the storage voltage line 90 but not between the pull-down unit 440 and the storage voltage line 90. As a result, the first pad 62 may be separated from the first output lines (24a and 24b) by a distance greater than the appropriate distance. This can prevent the generation of static electricity between the first pad 62 and the first output lines (24a and 24b).

A gate driving apparatus according exemplary embodiments as described herein is integrated onto a non-display region (indicated by reference character PA in FIG. 1) of a substrate. Thus, additional parts, such as a printed circuit board (PCB), for example, are not required, thereby substantially reducing manufacturing costs of the gate driving apparatus and a display device including the same.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A gate driving apparatus comprising:
    a plurality of stages arranged sequentially, each stage adapted to output a gate signal and comprising first output lines and a second output line,
    wherein the first output lines are electrically connected to a gate line corresponding to each of the stages, are adapted to transmit the gate signal to a plurality of pixels coupled to the gate line, and are adapted to transmit the gate signal to a reset terminal of a subsequent stage of each of the stages, and the second output line is adapted to transmit the gate signal to a set terminal of a preceding stage of each of the stages,
    wherein the first output lines and the second output line are electrically connected with a contact pad unit,
    wherein the contact pad unit comprises a first bridge region and a second bridge region, each including one or more pairs of contact pads which are electrically connected by a bridge structure, and
    wherein the first output lines and the second output line are configured to transmit the gate signal of the current stage.

2. The gate driving apparatus of claim 1, wherein the one or more pairs of the contact pads of the contact pad unit include a first contact pad and a second contact pad, each of the stages comprises a pull-up unit which is adapted to generate the gate signal, and the first output lines comprise a first gate signal transmission line which is adapted to transmit the gate signal generated by the pull-up unit to the first contact pad and a second gate signal transmission line which is connected to the second contact pad electrically connected to the first contact pad by the bridge structure and is adapted to transmit the gate signal to the gate line.

3. The gate driving apparatus of claim 2, wherein the first gate signal transmission line of the first output lines is connected to the second output line by the first contact pad.

4. The gate driving apparatus of claim 1, wherein each of the stages comprises the pull-up unit, a pull-down unit, and a storage voltage line, wherein the pull-up unit is adapted to generate the gate signal, the pull-down unit is adapted to receive a gate signal of a subsequent stage and is adapted to discharge the gate signal of each of the stages to an off voltage, the storage voltage line is disposed between the pull-up and pull-down units and the contact pad unit, wherein the first output lines are disposed between the pull-up unit and the storage voltage line but are not disposed between the pull-down unit and the storage voltage line.

5. The gate driving apparatus of claim 1, wherein the one or more pairs of the contact pads of the contact pad unit includes a first pair of contact pads including a first contact pad and a second contact pad which is electrically connected to the first contact pad by the bridge structure, and one or more additional pairs of contact pads which are electrically connected by the bridge structure, wherein the one or more pairs of the contact pads of the contact pad unit are adapted to transmit the gate signal of a subsequent stage to a preceding stage.

6. The gate driving apparatus of claim 1, wherein the gate line is a main gate line which is adapted to receive the gate signal through the first output lines, and each of the stages comprises a down gate line, wherein the down gate line is adapted to receive a gate signal of a subsequent stage through the second output line.

7. A gate driving apparatus comprising:
    a plurality of stages arranged sequentially, each stage is adapted to output a gate signal and comprising a pull-up unit, first output lines, a second output line, a pull-down unit, and a storage voltage line,
    wherein the pull-up unit is adapted to generate the gate signal,
    wherein the first output lines are electrically connected to a gate line corresponding to each of the stages, are adapted to transmit the gate signal to a plurality of pixels coupled to the gate line and are adapted to transmit the gate signal to reset terminal of a subsequent stage of each of the stages,
    wherein the second output line is adapted to transmit the gate signal to a set terminal of a preceding stage of each of the stages, the pull-down unit is adapted to receive a gate signal of a subsequent stage and is adapted discharge the gate signal of each of the stages to an off voltage,
    wherein the storage voltage line is disposed between the pull-up and pull-down units and a contact pad, wherein the first output lines are disposed between the pull-up unit and the storage voltage line but are not disposed between the pull-down unit and the storage voltage line,
    wherein the first output lines and the second output line are configured to transmit the gate signal of the current stage, and
    wherein the contact pad comprises a first bridge region and a second bridge region.

8. The gate driving apparatus of claim 7, wherein the first output lines comprise a first gate signal transmission line which is adapted to transmit the gate signal generated by the pull-up unit to a first contact pad and a second gate signal transmission line which is connected to a second contact pad electrically connected to the first contact pad and is adapted to transmit the gate signal to the gate line.

9. The gate driving apparatus of claim 8, wherein the second output line branches off from the first gate signal transmission line of the first output lines.

10. The gate driving apparatus of claim 7, wherein the first output lines and the second output line share one contact pad.

11. The gate driving apparatus of claim 7, wherein each of the stages comprises:
    the first contact pad which is shared by the first output lines and the second output line;
    the second contact pad which is electrically connected to the first contact pad; and
    one or more pairs of contact pads which are electrically connected by a bridge structure, wherein the pairs of the contact pads are adapted to transmit the gate signal of a subsequent stage to a preceding stage.

12. A display device comprising:
    a substrate comprising a display region in which a plurality of pixels are arranged and a non-display region which is a region excluding the display region; and a gate driver comprising a gate driving apparatus which is formed in the non-display region, wherein the gate driver comprises a plurality of stages arranged sequentially, each stage is adapted to output a gate signal and comprising first output lines, and a second output line, wherein the first output lines are connected to a gate line corresponding to each of the stages, are adapted to transmit the gate signal to a plurality of pixels coupled to the gate line and are adapted to transmit the gate signal to a reset terminal of a subsequent stage of each of the stages, wherein the second output line is adapted to transmits the gate signal to a set terminal of a preceding stage of each of the stages, wherein the first output lines and the second output line are electrically connected with a contact pad unit, wherein the contact pad unit comprises a first bridge region and a second bridge region, each including one or more pairs of contact pads which are electrically connected by a bridge structure, and wherein the first output lines and the second output line are configured to transmit the gate signal of the current stage.

13. The display device of claim 12, wherein the one or more pairs of the contact pads of the contact pad unit includes a first contact pad and a second contact pad, wherein each of the stages comprises a pull-up unit which is adapted to generate the gate signal, and the first output lines comprise a first gate signal transmission line which is adapted to transmit the gate signal generated by the pull-up unit to the first contact pad and a second gate signal transmission line which is connected to the second contact pad electrically connected to the first contact pad by the bridge structure and is adapted to transmit the gate signal to the gate line.

14. The display device of claim 13, wherein the first gate signal transmission line of the first output lines is connected to the second output line by the first contact pad.

15. The display device of claim 12, wherein each of the stages comprises the pull-up unit, a pull-down unit, and a storage voltage line, wherein the pull-up unit is adapted to generate the gate signal, the pull-down unit is adapted to receive a gate signal of a subsequent stage and is adapted to discharge the gate signal of each of the stages to an off voltage, the storage voltage line is disposed between the pull-up and pull-down units and the contact pad unit, wherein the first output lines are disposed between the pull-up unit and the storage voltage line but are not disposed between the pull-down unit and the storage voltage line.

16. The display device of claim 12, wherein the one or more pairs of the contact pads of the contact pad unit includes a first pair of contact pads including a first contact pad and a second contact pad which is electrically connected to the first contact pad by the bridge structure, and one or more additional pairs of contact pads which are electrically connected by the bridge structure, wherein the one or more pairs of the contact pads of the contact pad unit are adapted to transmit the gate signal of a subsequent stage to a preceding stage.

17. A display device comprising:

a liquid crystal panel comprising a first substrate comprising a display region on which a plurality of gate lines extending along a substantially row direction and substantially parallel to each other, a plurality of data lines extend along a substantially column direction and substantially parallel to each other, a plurality of pixel switching devices and a plurality of pixel electrodes are disposed and a non-display region which is a region excluding the display region and a second substrate on which a plurality of color filters and a common electrode are formed and a liquid crystal layer interposed between the first substrate and the second substrate;

a timing controller adapted to receive input control signals and to output a first control signal and a second control signal;

a data driver adapted to receive an image signal and the first control signal from the timing controller and adapted to provide image data voltages, which correspond to the image signal to the plurality of data lines and wherein the first control signal received from the timing controller controls operation of the data driver;

a clock generator adapted to receive the second control signal from the timing controller and adapted to output a clock signal and a clock bar signal using a gate-on voltage and a gate-off voltage in response to receiving the second control signal from the timing controller;

a gate driver comprising a gate driving apparatus which is formed in the non-display region of the first substrate of the liquid crystal panel, the gate driver adapted to generate a plurality of gate signals using the clock signal and the clock bar signal received from the clock generator and is adapted to sequentially transmit the gate signals to the gate lines, and wherein the gate driver comprises a plurality of stages arranged sequentially, wherein each stage is adapted to output a gate signal and comprising first output lines, and a second output line, wherein the first output lines are connected to a gate line corresponding to each of the stages, are adapted to transmit the gate signal to a plurality of pixels coupled to the gate line, and are adapted to transmit the gate signal to a reset terminal of a subsequent stage of each of the stages, wherein the second output line is adapted to transmit the gate signal to a set terminal of a preceding stage of each of the stages, wherein the first output lines and the second output line are electrically connected with a contact pad unit, wherein the contact pad unit comprises a first bridge region and a second bridge region, each including one or more pairs of contact pads which are electrically connected by a bridge structure, and wherein the first output lines and the second output line are configured to transmit the gate signal of the current stage.

18. The display device of claim 17, wherein the data driver is disposed as integrated circuits connected to the liquid crystal panel in the form of a tape carrier package (TCP).

19. The display device of claim 17, wherein the data driver is disposed in the non-display region of the first substrate of the liquid crystal display panel.

20. The display device of claim 17, wherein the gate driver is a plurality of gate drivers disposed on a first side and a second side of the non-display region of the first substrate of the liquid crystal panel, wherein the gate drivers disposed on the first side of the non-display region of the first substrate are adapted to drive even gate lines of the plurality of gate lines and wherein gate drivers disposed on the second side of the non-display region are adapted to drive odd gate lines of the gate lines.

* * * * *